Figure 1:
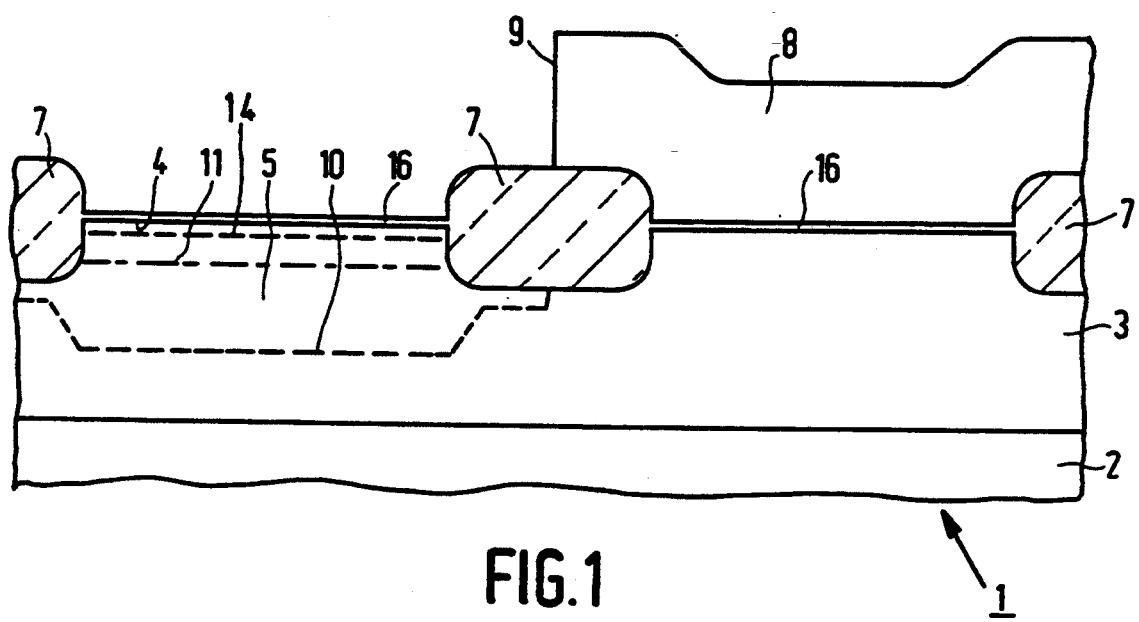

United States Patent [19]

Stolmeijer et al.

[11] Patent Number: 5,384,279
[45] Date of Patent: Jan. 24, 1995

[54] METHOD OF MANUFACTURING A SEMICONDUCTOR DEVICE COMPRISING A SILICON BODY IN WHICH SEMICONDUCTOR REGIONS ARE FORMED BY ION IMPLANTATIONS

[75] Inventors: André Stolmeijer; Paulus M. T. M. Van Attekum; Hubertus Den Blanken; Paulus A. Van Der Plas; Reinier De Werdt, all of Eindhoven, Netherlands

[73] Assignee: U.S. Philips Corporation, New York, N.Y.

[21] Appl. No.: 144,091

[22] Filed: Oct. 27, 1993

Related U.S. Application Data

[63] Continuation of Ser. No. 349,367, May 9, 1989, abandoned.

[30] Foreign Application Priority Data

Sep. 9, 1988 [NL] Netherlands .................. 8802219

[51] Int. Cl.⁶ ............................................. H01L 21/70
[52] U.S. Cl. ................................. 437/57; 437/26; 437/29; 437/34; 437/45
[58] Field of Search ................. 437/26, 27, 28, 34, 437/45, 57

[56] References Cited

U.S. PATENT DOCUMENTS 4,027,380  6/1977  Deal et al. ......................... 437/34
4,217,149  8/1980  Sawazaki ........................... 437/45
4,411,058 10/1983  Chen ................................... 437/27
4,422,885 12/1983  Brower et al. ................... 437/45
4,729,964  3/1988  Natsuaki et al. ................. 437/34
4,745,083  5/1988  Huie .................................... 437/45
4,771,014  9/1988  Liou et al. ......................... 437/27

OTHER PUBLICATIONS

Sze, S. M. *VLSI Technology*, New York, McGraw-Hill, (1983), p. 485, lines 17–20; sections 11.5.1, 11.5.2, 11.5.3, 11.4.2; p. 488, lines 4–5.

*Primary Examiner*—T. Thomas
*Attorney, Agent, or Firm*—Paul Miller

[57] ABSTRACT

A method of manufacturing a semiconductor device is set forth, comprising a silicon body (1) having a surface (4) where there are situated a number of semiconductor regions (5, 6) and field oxide regions (7). The semiconductor regions is formed, after the field oxide regions have been provided, by implantations of n-type and p-type dopants. In accordance with the invention the implantations with the n-type dopant (10, 11, 14), which are performed using an implantation mask (8) provided on the surface and comprising openings (9) at the area of a part of the semiconductor regions (5) to be formed, are combined with the implantations with the p-type dopant (12, 13, 15) which are carried out without using the implantation mask. Thus, the semiconductor regions (5, 6) are realised by means of a single implantation mask (8).

7 Claims, 2 Drawing Sheets

METHOD OF MANUFACTURING A SEMICONDUCTOR DEVICE COMPRISING A SILICON BODY IN WHICH SEMICONDUCTOR REGIONS ARE FORMED BY ION IMPLANTATIONS

This application is a continuation of parent application, Ser. No. 07/349,367, filed May 9, 1989, now abandoned and all benefits of such earlier application are hereby claimed for this new continuation application.

The invention relates to a method of manufacturing a semiconductor device, comprising a silicon body with a number of semiconductor regions which are insulated from one another by field oxide regions and which adjoin a surface of the silicon body, the semiconductor regions being formed, after formation of the field oxide regions, by implantations with n-type and p-type dopants.

The field oxide regions can be formed in a customary manner by local oxidation of silicon. They may be completely recessed into the silicon body so that the silicon body has a perfectly flat surface; however, they can alternatively be provided so that they are only partly recessed into the silicon body.

The field oxide regions are used for insulating semiconductor elements formed in the semiconductor regions from one another. When the semiconductor regions are used to form MOS transistors therein, they should have appropriate semiconductor properties which can be realized by the implantations of dopants.

BACKGROUND OF THE INVENTION

From R. de Werdt et al, IEDM 1987, pp. 532-535, a method of the kind set forth is known where an n-type semiconductor region and a p-type semiconductor region are formed adjacently after the formation of field oxide regions. These semiconductor regions extend partly underneath field oxide regions where they adjoin one another. For the formation of these regions an implantation with an n-type dopant and an implantation with a p-type dopant are carried out with such a high implantation energy that a maximum doping concentration is obtained just underneath the field oxide regions. The semiconductor regions thus formed are referred to as an n-well and a p-well, respectively. The highly doped parts of the semiconductor regions which are situated just underneath the field oxide regions enhance the insulating effect of the field oxide regions; these parts are also referred to as channel stoppers. In the n-well a p-channel MOS transistor is formed; in the p-well an n-channel MOS transistor is formed. In order to ensure that these transistors obtain suitable properties, a further implantation with dopants is performed in the n-well as well as in the p-well. This further implantation serves to impart a suitable high breakdown strength to the transistors and is also referred as an anti-punch-through implantation.

SUMMARY OF THE INVENTION

The invention inter alia has for its object to provide a method whereby the known, described semiconductor device can be very simply manufactured.

To achieve this, the method in accordance with the invention is characterized in that for the formation of the semiconductor regions the implantations with n-type dopants, being carried out via windows made, at the area of a part of the semiconductor regions to be formed, in an implantation mask provided on the surface are combined with implantations with p-type dopants which are carried out without using an implantation mask.

During the implantations with the p-type dopants, p-type semiconductor regions are formed in those parts of the silicon body which were shielded by the implantation mask during the implantations with the n-type dopants. For example, p-wells will be formed in which n-channel MOS transistors can subsequently be formed. In the parts of the semiconductor body which were not shielded during the implantations with the n-type dopants, the n-type and p-type doping is combined by the method in accordance with the invention. It has been found that the n-type doping and the p-type doping exhibit a doping concentration which varies as a function of the depth in the silicon body, or doping profile, enabling the p-type dopant to be fully compensated by the n-type dopant. This means that the method in accordance with the invention is also suitable for forming n-type semiconductor regions which are suitable for use as n-wells for MOS transistors. Because the doping profiles enable said compensation immediately after implantation, comparatively accurately defined semiconductor regions having a depth of less than 1 $\mu$m can be realized.

After the execution of the implantations, in practice the semiconductor body is heated to a temperature of approximately 800° C. for a brief period of time approximately 30 minutes. This thermal treatment is carried out in order to repair the radiation damage caused by the implantations. The doping profiles exhibited by the n-type and p-type dopings immediately after implantation are hardly influenced by this comparatively short thermal treatment.

Using the method in accordance with the invention, the n-wells and p-wells can be simply realised in the known described semiconductor device by means of only a single implantation mask. After provision of this mask, the two implantations are carried out with n-type dopant (n-well implantation and anti-punch-through implantation). Subsequently, the implantation mask is removed after which the two implantations with p-type dopant are carried out without a mask. The implantations are carried out so that the maximum doping concentration of the n-type dopant amounts to approximately twice that of the p-type dopant. The resultant wells exhibit a substantially equal net doping (of the opposite conductivity type). The two implantations with p-type dopant can also be carried out before the provision of the implantation mask and before carrying out the implantations with the n-type dopant.

Preferably the method in accordance with the invention is characterized in that for the formation of the semiconductor regions each implantation with an n-type dopant is combined with an implantation with a p-type dopant which is carried out using such an energy that both implantations exhibit a maximum doping concentration at substantially the same depth in the silicon body.

When an n-type and a p-type dopant are implanted in silicon, silicon oxide or through silicon oxide in silicon, so that they exhibit a maximum doping concentration at the same depth, it is found that the n-type doping exhibits a doping profile which is wider than that of the p-type doping. The depth is in this case measured from the surface of the silicon body. If this surface is not flat, as in the case of only partly recessed field oxide in the silicon body, the depth of maximum doping concentration, of course, will follow this non-flat surface. Because of the fact that both dopings exhibit a maximum at the same depth in the silicon body, n-type doping exhibiting a wider doping profile than the p-type doping, dopings which are important in practice can be realized.

A first case in accordance with the invention is characterized in that the implantation with the n-type dopant is carried out with a dose which is higher than that of the implantation with the p-type dopant.

Because the n-type doping then exhibits a doping profile which is wider than that of the p-type doping, more n-type dopant will be present at all areas where the p-type dopant is implanted. The p-type doping is thus fully compensated. This method is particularly suitable for forming the n-wells described above.

A second case in accordance with the invention is characterized in that the implantation with the n-type dopant is carried out with a dose which is lower than that of the implantation with the p-type dopant, the two implantations to be combined then being carried out with an energy such that on the surface of the silicon body the p-type dopant has a concentration which is higher than that of the n-type dopant. Thus, a surface layer is formed of the p-type with a maximum doping concentration at the areas where both implantations exhibit a maximum doping concentration. Deeper into the silicon body the semiconductor region changes over into an n-type region. This method is particularly suitable for providing the p-well as well as the n-well with a p-type top layer, which top layer is differently doped because the p-type top layer in the n-well consists of p-type dopant which is partly compensated by n-type dopant. In n-wells and p-wells thus formed complementary MOS transistors can be provided (a p-channel type in the n-well and an n-channel type in the p-well) with a gate electrode of n-type conductive polycrystalline silicon, the transistors exhibiting the same threshold voltage in an absolute sense. The threshold voltage of such transistors is determined inter alia by the conductivity of said p-type top layers. This conductivity, however, must be separately adjusted for p-channel and n-channel transistors, notably in the case of transistors having sub-micron dimensions. This can be readily realised by way of the method described above.

An equal threshold voltage in an absolute sense can also be realised for the n-channel and p-channel transistor by utilising n-type dopant which is present near the surface because of an implantation having its maximum doping concentration deeper into the silicon body. To achieve this the method is characterized in that for the formation of the semiconductor regions an implantation with an n-type dopant is combined not only with a first implantation with a p-type dopant which has its maximum doping concentration at substantially the same depth in the silicon body as that of the implantation with the n-type dopant, but also with a second implantation with a p-type dopant which is carried out with energy which is lower than that of the first implantation and with such a dose that on the surface of the silicon body the p-type dopant has a concentration which is higher than that of the n-type dopant. According to this method, an implantation with n-type dopant is combined with two implantations with p-type dopant, whereas in the previously described methods only one implantation with p-type dopant was concerned each time. The advantage consists in that one implantation is saved. It is a drawback, however, that the method is less flexible because three implantations are combined, it being necessary to adapt the energy and dose of the implementations to one another. Surprisingly, however, it has been found that this method can still be advantageously used for forming transistors having sub-micron dimensions.

The method is further characterized in that the implementation with p-type dopant, carried out with such a dose and energy that on the surface of the silicon body the p-type dopant exhibits a concentration which is higher than that of the n-type dopant, is performed only after the surface of the silicon body has been provided with a layer of gate oxide. As a result, the p-type doped top layers can be realised at a minimum distance below the surface. This is important notably for the n-channel transistor. When the p-type implementation which determines the threshold voltages in this type of MOS transistor is situated deeper in the p-well, the switching of such a transistor will be slower than that of a transistor in which this implementation is situated less deep. For the formation of a layer of gate oxide having a thickness of from 15 to 20 nm, as is customary in MOS transistors having sub-micron dimensions, the silicon body must be heated to a temperature of approximately 900° C. for approximately 30 minutes. During this oxidation of the silicon body, the implanted dopants are displaced. Even though displacement is accelerated by the oxidation, it is far less than that during the thermal treatment required for forming the field oxide regions. Consequently, it is not possible to realise a p-type surface layer in a p-type well for a p-channel transistor within the above minimum depth. It is to be noted that the other implementations with p-type dopant, mentioned above, i.e. the implementation for forming the wells and for increasing the breakdown voltage, are less critical and are preferably performed prior to the formation of the gate oxide.

Preferably, the implantation with n-type dopant is carried out before the surface is provided with the layer of gate oxide. Thus, it is not necessary to provide an implantation mask for carrying out the masked implantation with n-type dopant on the layer of gate oxide. This is a major advantage because the layer of gate oxide could be seriously damaged during the removal of an implantation mask. Moreover, this method offers the advantage that the implantations required for forming the wells, for increasing the breakdown voltage (anti-punch-through), and for adjusting the threshold voltage during the manufacture of a CMOS circuit, can be realised by means of only a single implantation mask.

Even though several n-type and p-type dopants can be used for carrying out the described methods, the most commonly used dopants are phosphorous, arsenic, aluminium and boron. Preferably, phosphorous is used as the n-type dopant and boron is used as the p-type dopant. Arsenic is not to be preferred, because its implantation requires a much higher implantation energy than that required for the implantation of boron and phosphorous. Furthermore, it is advantageous that boron and phosphorous do not exhibit a strongly deviating diffusion behaviour at a temperature of 900° C. During the slight diffusion which still occurs after implantation, such as during the formation of gate oxide, therefore, the relative position of the doping profiles of boron and phosphorous hardly changes.

DESCRIPTION OF THE DRAWING FIGURES

Figure 6:
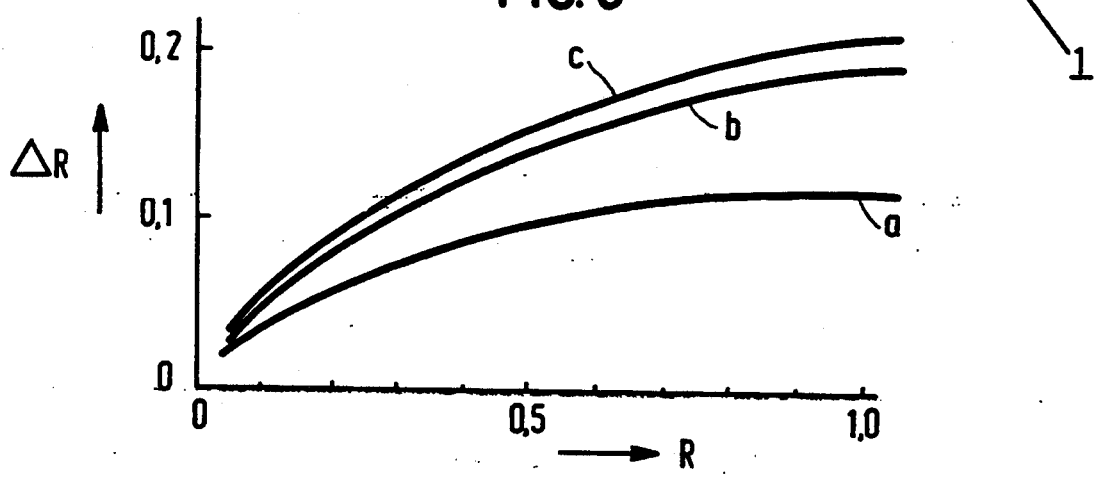

The invention will be described in detail hereinafter, by way of example, with reference to a drawing. Therein:

FIGS. 1, 2, 3, 4 and 5 diagrammatically illustrate some stages of manufacture of a semiconductor device realised by means of the method in accordance with the invention, and FIG. 6 shows the width $\Delta R$ of doping profiles of some dopants as a function of the depth R of the doping maximum after implantation of these dopants in silicon or silicon oxide.

DESCRIPTION OF THE INVENTION

FIGS. 1 to 5 are diagrammatic cross-sectional illustrations of some stages of the manufacture of a semiconductor device which is realized by means of the method in accordance with the invention. The Figures show the manufacture of an n-channel MOS transistor and a p-channel MOS transistor as present in large numbers in customary CMOS circuits. The semiconductor device comprises a silicon body 1 which in this case consists of a comparatively highly doped silicon substrate 2 having a lesser doped epitaxially grown top layer 3 with a resistivity of approximately 10 Ohm/cm. The silicon body comprises a surface 4 on which a number of semiconductor regions 5, 6 and field oxide regions 7 are situated. After the formation of the field oxide regions 7 in the usual manner, the semiconductor regions 5, 6 are formed by implantations of n-type and p-type dopants. A plurality of such implantations are performed in order to impart such semiconductor properties to the semiconductor regions 5, 6 that they are suitable for forming MOS transistors therein. The field oxide regions 7 can be formed in various ways; for example wells can be etched into the silicon body, which wells are subsequently filled with silicon oxide. In the present example, field oxide regions having a thickness of approximately 600 nm are formed by locally oxidising silicon, using a conventional oxidiation mask, by heating the silicon body 1 covered by the mask in steam for approximately 3 hours to a temperature of approximately 1000° C. If the dopants were already present in the semiconductor body, during such a thermal treatment, they would be displaced comparatively far into the semiconductor body by diffusion.

In the present example an n-type semiconductor region 5 and an adjoining p-type semiconductor region 6 are formed. These regions, in which a p-channel MOS transistor and an n-channel MOS transistor are to be formed at a later stage, are referred to as an n-well and a p-well, the respectively.

For the formation of the semiconductor regions 5, 6 in accordance with the invention the implantations with the n-type dopants, being carried out via openings 9 which are made in an implantation mask 8 of photolacquer having a thickness of approximately 2.5 $\mu$m and being provided on the surface 4, and which are situated at the area of a part of the semiconductor regions 5 to be formed (only one of which is shown for the sake of clarity), are combined with implantations with p-type dopants which are carried out without implantation mask. The former implantations are carried out in FIG. 1 and the latter implantations (without a mask) are carried out in FIG. 2.

During the implantations with p-type dopants, p-type semiconductor regions 6 are formed in these parts of the silicon body 1 which were shielded by the implantation mask 8 during the implantations with the n-type dopants. In the parts which were not shielded during the implantation with the n-type dopants, n-type as well as p-type dopants are implanted. It has been found that the n-type doping and the p-type doping exhibit a dopant concentration, which varies as a function of the depth in the silicon body, also referred to as doping profile, thus enabling the n-type doping to compensate the p-type doping completely. This means that the method in accordance with the invention is also suitable for forming n-type semiconductor regions 5 which are suitable for forming p-channel MOS transistors therein. Because the doping profiles enable the compensation immediately after implantation, semiconductor regions 5, 6 having a depth of less than 1 $\mu$m can be realised.

Using the method in accordance with the invention, the n-wells 5 and the p-wells 6 can be formed merely by means of the single implantation mask 8 shown. The implantations are carried out so that the maximum doping with the n-type dopant is about twice as high as that with the p-type dopant. The resultant wells 5, 6 then exhibit a substantially equal net doping (of the opposite conductivity type).

For the formation of the semiconductor regions 5, 6 in accordance with the invention each implantation with an n-type dopant is combined with an implantation with a p-type dopant which is carried out with an energy such that both implantations exhibit a maximum doping concentration at substantially the same depth in the silicon body. FIG. 6 shows the width $\Delta R$ of the doping profiles of some dopants as a function of the depth R of the maximum doping concentration after implantation of these dopants in silicon or silicon oxide. The curve a refers to boron, the curve b to phosphorous and the curve c to arsenic. These are the most practical dopants. In practice use is also made of composite ions for implanting dopants, such as $BF_2^+$, but these dopants also behave as shown in FIG. 6. Generally speaking, p-type dopants exhibit a smaller width $\Delta R$ than n-type dopants for the same depth R of the maximum doping concentration. Utilising this fact, important dopings can be very simply realised in practice as will be described hereinafter.

Figure 2:
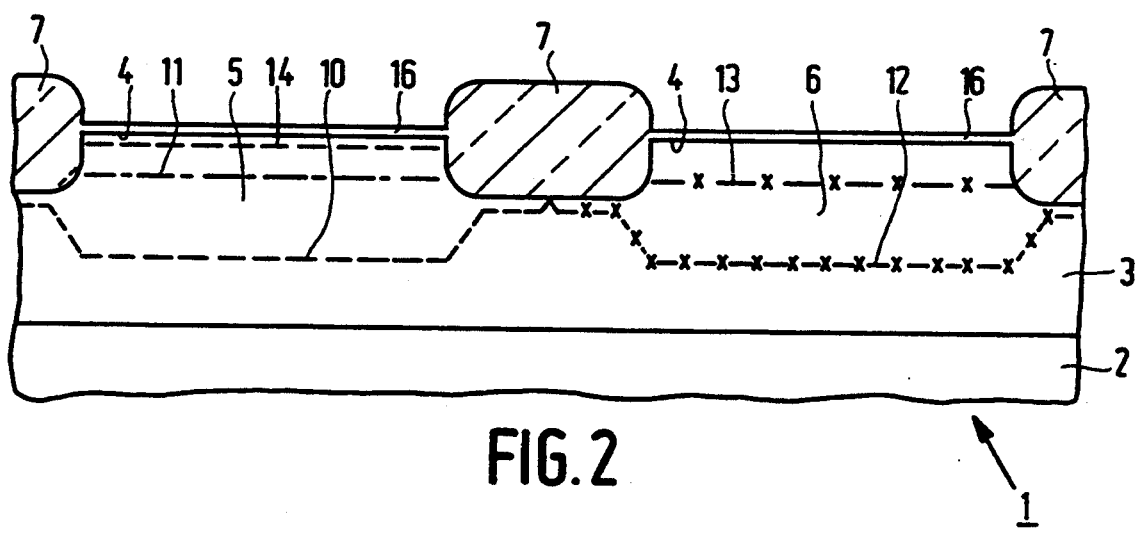
Figure 3:
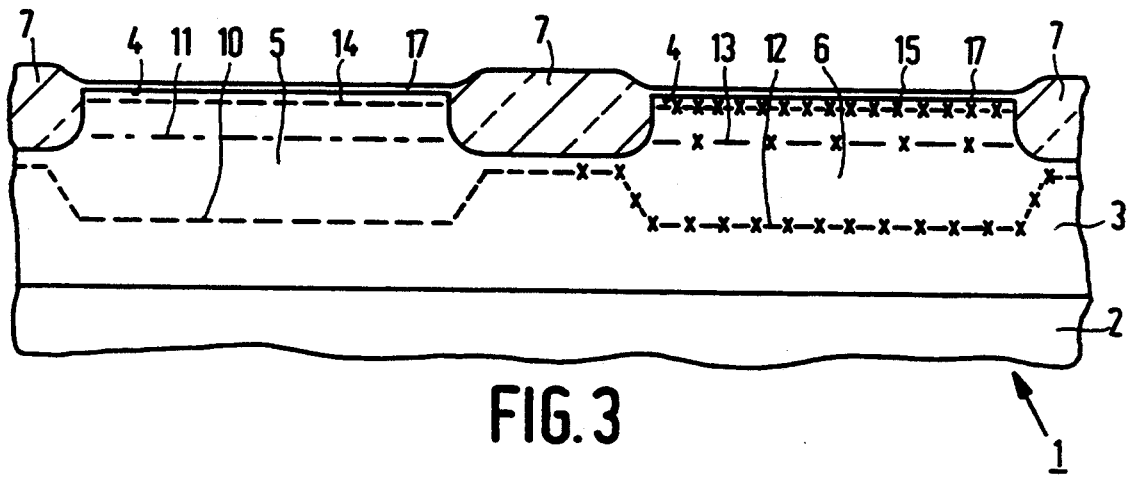
Figure 4:
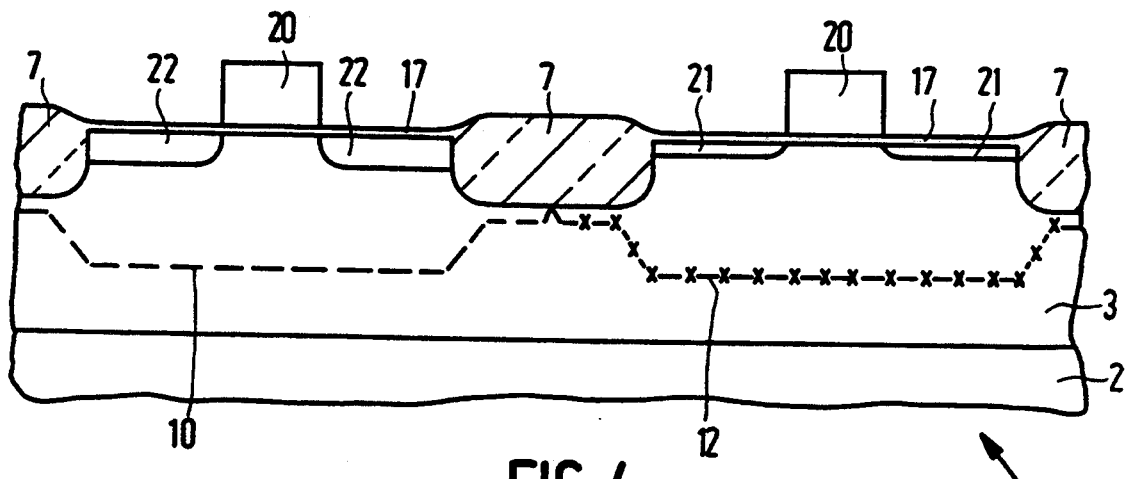
Figure 5:
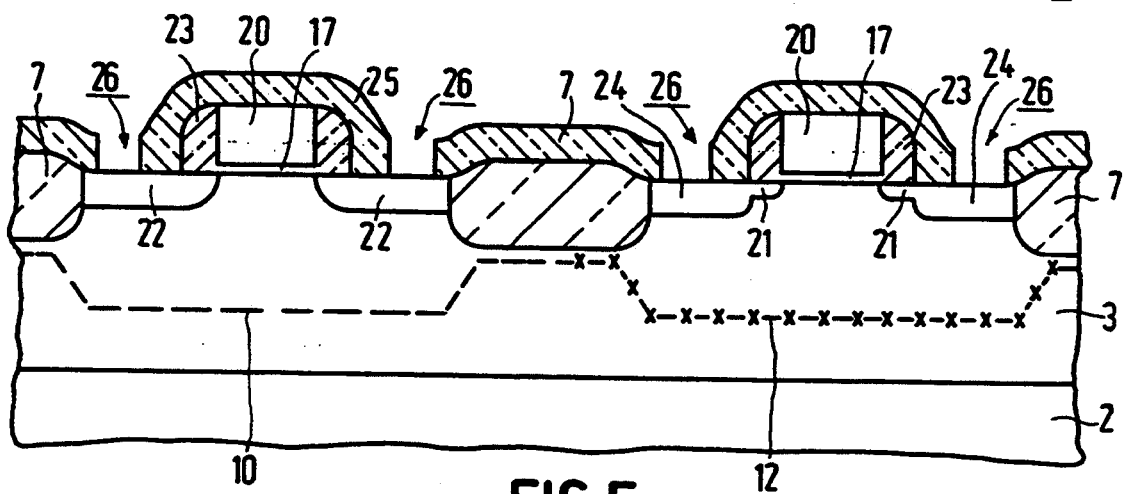

In a first case the implantation with the n-type dopant is carried out with a dose which is higher than that of the implantation with the p-type dopant. The n-type dopant is thus implanted with a dose (=number, of ions per cm$^2$) which is higher than that of the p-type dopant. In all locations where p-type dopant and n-type dopant are present together in the silicon body, the p-type dopant will then be fully compensated by the n-type dopant. In the present example two implantations are performed in this manner. The first implantation, denoted by the line 10 in FIG. 1, is an implantation of phosphorous ions with an energy of 500 KeV and a dose of $9 \times 10^{12}$ ions per cm$^2$. This implantation exhibits a maximum doping concentration, denoted by the line 10, which is situated just underneath the field oxide region 7 and approximately 550 nm below the surface 4 in the silicon body 1. The second implantation, denoted by the line 11 in FIG. 1, is an implantation of phosphorous ions with an energy of 200 KeV and a dose of $2 \times 10^{12}$ ions per cm$^2$. This implantation exhibits a maximum doping concentration, denoted by the line 11, at a depth of approximately 200 nm. After removal of the implantation mask 8, two implantations are carried out with boron ions which cooperate, with the two implantations with phosphorous ions in the described manner. A first implantation, denoted by the line 12 in FIG. 2, is an implantation with boron ions with an energy of 200 KeV and a dose of $4 \times 10^{12}$ ions per cm$^2$. This implantation exhibits a maximum doping which is situated just underneath the field oxide region 7, approximately 550 nm below the surface 4. Therefore, this implantation is fully compensated in the semiconductor region 5. The result of the first two implantations, therefore, is an n-type doping in the semiconductor region 5 with a maximum doping concentration which varies in accordance with the line 10, and a p-type doping in the semiconductor region 6 with a maximum doping concentration which varies in accordance with the line 12. The second implantation with boron ions is performed with ions with an energy of 80 KeV and a dose of $4 \times 10^{11}$ ions per cm$^2$. This implantation exhibits a maximum doping concentration at a depth of approximately 200 nm as denoted by a line 13. This implantation is also fully compensated by the second phosphorous implantation in the semiconductor region 5. The result of the two second implantations, therefore, is an n-type doping in the semiconductor region 5 with a maximum doping concentration in accordance with the line 11, and a p-type doping in the semiconductor 6 with a maximum doping concentration in accordance with the line Thus, the semiconductor region 5 is formed with an n-well implantation 10 and an anti-punch-through implantation 11, and the semiconductor region 6 is formed with a p-well implantation 12 and an anti-punch-through implantation 13.

In another practical case, which is also used in the present example, the implantation with the n-type dopant is carried out with a dose which is lower than that of the implantation with the p-type dopant, the two implantations being carried out with such an energy that at the surface 4 of the silicon body the D-type dopant has a concentration which is higher than that of the n-type dopant. Thus, a surface layer is formed of p-type conductivity with a maximum doping concentration at the area where both dopings exhibit a maximum doping concentration. Deeper into the silicon body the semiconductor region then changes over into an n-type region. Thus, in the example an implantation is performed in the semiconductor region 5, using the implantation mask 8, with phosphorous ions with an energy of 80 KeV and a dose of $1 \times 10^{12}$ ions per cm$^2$. This implantation has a maximum doping concentration which is denoted by a line 14 and which is situated at a depth of less than 100 nm in the semiconductor body 1. Subsequently, without using a mask, an implantation is performed with boron ions with an energy of 15 KeV and a dose of $1.4 \times 10^{12}$ ions per cm$^2$. This implantation exhibits a maximum doping concentration which is denoted by a line 15 and which is also situated at a depth of less than 100 nm in the semiconductor body. In both previously formed wells 5 and 6 a differently doped p-type top layer is thus formed at the same depth. When a p-channel MOS transistor and an n-channel MOS transistor are subsequently formed in these wells 5, 6 (as will be described hereinafter) with a gate electrode of n-type polycrystalline silicon having a width of approximately 0.7 μm, these transistors will exhibit a substantially equal threshold voltage of approximately 0.7 V in an absolute sense. A different conductivity of the p-type top layers is necessary in order to realise the equal threshold voltages in the case of very small transistors (sub-micron).

An equal threshold voltage (in an absolute sense) for the n-channel and p-channel transistors can also be realised when for the formation of the semiconductor regions 5, 6 an implantation with an n-type dopant is combined not only with a first implantation with a p-type dopant which exhibits its maximum doping concentration at substantially the same depth in the silicon body as that of the implantation with the n-type dopant, but also with a second implantation with a p-type dopant which is carried out with a lower energy than that of the first implantation and with such a dose that on the surface of the silicon body the p-type dopant exhibits a concentration which is higher than that of the n-type dopant. One implantation with an n-type dopant is then combined with two implantations with p-type dopant, utilising the n-type dopant present near the surface 4 due to an implantation which exhibits its maximum doping concentration deeper into the silicon body. Thus, for example after the execution (as already described) of an implantation of phosphorous ions with an energy of 500 KeV and a dose of $9 \times 10^{12}$ ions per cm$^2$, an implantation of arsenic ions with an energy of 400 KeV and a dose of $5 \times 10^{12}$ ions per cm$^2$ can be carried out in the regions 5. The implantation with phosphorous ions is combined, as has already been described, with an implantation with boron ions with an energy of 200 KeV and a dose of $4 \times 10^{12}$ ions per cm$^2$. The implantation with arsenic ions is now combined with two implantations with p-type dopant. A first implantation with boron ions with an energy of 70 KeV and a dose of $1 \times 10^{12}$, which exhibits a maximum doping concentration which is situated at substantially the same depth in the silicon body as that of the arsenic implantation, that is to say at approximately 150 nm. A second implantation with boron ions with an energy of 20 KeV, or with BF$_2^+$ ions with an energy of 40 KeV, and a dose of $1 \times 8.10^{12}$ ions per cm$^2$, which is combined with arsenic ions present near the surface. Even though one implantation step is thus saved, this method is less flexible because it is necessary to adapt three implantations to one another instead two implantations as before. Surprisingly, it has been found that semiconductor regions 5, 6 of the described kind can be manufactured in which MOS transistors can be provided, in the manner yet to be described, with gate electrodes 20 having a width of approximately 0.5 μm. In an absolute sense, these transistors have a substantially equal threshold voltage of approximately 0.8 V.

The described implantations for the formation of the dopings 10, 11, 12, 13 and 14 were performed through a layer of silicon oxide 16 having a thickness of approximately 25 nm. After the implantations this layer is removed and replaced by a layer of gate oxide 17 having a thickness of approximately 15 nm. This layer is formed by heating the silicon body at a temperature of 900° C. for a period of approximately 30 minutes in an atmosphere with dry oxygen. In accordance with the invention the final implantation with boron ions whose maximum doping concentration is in accordance with the line 15, is carried out only after the surface 4 has been provided with the layer of gate oxide 17. It is thus achieved that the p-doped top layer in the p-well is not diffused into the semiconductor body by the thermal treatment required for forming gate oxide. Notably for the p-channel transistor it is very important that the p-type top layer which determines the threshold voltage of the transistor is situated as near as possible to the surface. In that case the transistor exhibits a faster switching behaviour in comparison with the situation where this top layer is situated deeper.

In accordance with the invention the n-type dopings are performed before providing the surface 4 with the layer of gate oxide 17. Thus, it is not only achieved that a single implantation mask 8 suffices for providing the n-wells and p-wells with all necessary implantations, but also the necessity of providing an implantation mask of photolacquer on the layer of gate oxide 17 in order to carry out the masked implantation with n-type dopant with the maximum doping concentration 14 is avoided. This is important because the layer of gate oxide could be seriously damaged during removal of photolacquer.

In the example the implantations are carried out with phosphorous ions and boron ions. These are the most practical dopants for the formation of the n-wells 5 and the p-wells 6. They can be implanted with a comparatively low energy and in practice they do not have excessively different diffusion coefficients. Use can also be made of arsenic ions which, however, necessitate much higher implantation energies.

The field oxide regions 7 initially have a thickness of approximately 600 nm, these regions being recessed into the silicon body 1 over approximately half their thickness. The implantation, being performed with the highest implantation energies, exhibits a maximum doping concentration 10, 12 which is situated just below the field oxide. In the center of the wells the maximum doping concentrations 10, 12 are situated deeper, that is to say approximately 550 nm below the surface 4. The n-well 5 and the p-well 6 are thus formed. The high doping just below the field oxide serves as a channel stopper in order to prevent the formation of parasitic transistors below the field oxide regions. The field oxide regions 7 have their initial thickness of approximately 600 nm in order to enable realisation of the described implantation maxima 10, 12. For insulation in the circuits to be formed they may be thinner; therefore, part of their thickness is removed by etching until a thickness of approximately 400 nm remains. Therefore, in FIGS. 3 to 5 field oxide regions having a smaller thickness are shown.

In the substrate in which the n-well and the p-well are denoted merely by the lines 10 and 12 (all implantations, however, have been carried out) transistors are then formed in a customary manner. First of all, gate electrodes 20 are formed on the gate oxide, using phosphorous doped polycrystalline silicon having a sheet resistance of approximately 20 ohms. While masking these gate electrodes 20, lightly doped n-type zones 21 with a doping of approximately $10^{18}$ atoms per cc and more strongly doped p-type zones 22 with a doping of approximately $10^{20}$ atoms per cc are formed by implantation of phosphorous ions and boron ions, respectively. To this end use must be made of implantation masks which are not shown in the Figures and which shield the n-well 10 and the p-well 12. Subsequently, the gate electrodes are provided in a customary manner with spacers 23 of silicon oxide by covering the surface 4 with a layer of silicon oxide and by subsequently subjecting the silicon body 1 to an anisotropic etching treatment. Subsequently, strongly doped n-type zones 24 with a doping of approximately $10^{20}$ atoms per cc are formed by implantation of arsenic ions. The required masking of the n-well 10 is not shown in the Figure. Finally, the assembly is covered with a layer of an insulating material 25 in which there are provided contact holes 26 for contacting the semiconductor zones formed. Thus, in the n-well a p-channel MOS transistor has been formed while an n-channel MOS transistor has been formed in the p-well.

The invention has been described with reference to an example in which n-wells and p-wells were formed in which complementary MOS transistors were provided. It will be apparent that other circuit elements can also be provided in these wells.

We claim:

1. A method of manufacturing a semiconductor device consisting essentially of the steps of
   (a) insulating a number of areas of a silicon body with field oxide,
   (b) forming semiconductor regions between said number of areas of field oxide, said semiconductor regions adjoining a surface of said silicon body, said semiconductor regions being formed by
       (i) forming an implantation mask at said surface, said implantation mask having windows at a first portion of said semiconductor regions,
       (ii) performing at least one step of ion implanting of n-type dopants into said silicon body through said windows at least at a first energy to form a maximum doping concentration of said n-type dopants at a first depth in said silicon body,
       (iii) removing said implantation mask,
       (iv) performing at least one step of ion implanting of p-type dopants into said silicon body over said surface, said p-type dopants being implanted into a second portion of semiconductor regions adjacent to said first portion of said semiconductor regions at least at a second energy to form a maximum doping concentration of said p-type dopants at substantially said first depth in said silicon body,
       (v) forming a layer of gate oxide on said surface of said silicon body, and thereafter
       (vi) carrying out another ion implantation of p-type dopant at a third energy lower than said second energy and at a dose to form p-type dopant at a concentration higher than that of said n-type dopant on said surface.

2. A method according to claim 1, wherein implanting with n-type dopants is always carried out before said step (v).

3. A method according to claim 1, wherein said step (ii) of implanting n-type dopants is carried out a higher concentration dose than in said step (iv) of implanting p-type dopants.

4. A method according to claim 1, wherein said step (ii) is carried out using phosphorous as said n-type dopant, and said step (iv) is carried out using boron as said p-type dopant.

5. A method according to claim 1, wherein another step of ion implanting n-type dopant is carried out before said step (iii) at an energy lower than said first energy and at a dose such that after step (vi) said p-type dopant at said surface has a concentration greater than concentration of n-type dopant at said surface.

6. A method according to claim 1, wherein said second energy is less than said first energy.

7. A method of manufacturing a semiconductor device consisting essentially of the steps
   (a) insulating a number of areas of a silicon body with field oxide,
   (b) forming semiconductor regions between said number of areas of field oxide, said semiconductor regions adjoining a surface of said silicon body, and said semiconductor regions being formed by (i) forming an implantation mask at said surface, said implantation mask having windows at first portions of said semiconductor regions, (ii) ion implanting n-type dopants into said silicon body through said windows at a first energy and a first concentration to a first depth, (iii) ion implanting n-type dopants into said silicon body through said windows at a second energy lower than said first energy and a second concentration lower than said first concentration to a second depth less than said first depth, (iv) ion implanting n-type dopant into said body through said windows at a third energy less than said second energy and a third concentration less than said second concentration to form a maximum doping concentration at a depth of less than 100 nm in said silicon body, (v) removing said implantation mask, (vi) ion implanting p-type dopant into said silicon body over said surface at a fourth energy less than said first energy and a fourth concentration less than said first concentration to substantially said first depth to form second portions of said semiconductor regions adjacent to said first portions, (vii) ion implanting p-type dopant into said second portions of said semiconductor regions at a fifth energy less than said fourth energy and at a fifth concentration less than said fourth concentration, (viii) forming a layer of gate oxide on said surface of said silicon body, and thereafter (ix) ion implanting p-type dopant at a sixth energy less than said fifth energy and at a sixth concentration greater than said third concentration to form a maximum doping concentration of p-dopant at a depth of less than 100 nm in said silicon body.

* * * * *